(12) United States Patent
Dumitru et al.

(10) Patent No.: US 12,069,870 B2
(45) Date of Patent: Aug. 20, 2024

(54) SYNAPSE ARRAY

(71) Applicant: CYBERSWARM, INC., San Mateo, CA (US)

(72) Inventors: Viorel-Georgel Dumitru, Ploiesti (RO); Cristina Besleaga Stan, Bucharest (RO); Alin Velea, Bucharest (RO); Aurelian-Catalin Galca, Magurele (RO)

(73) Assignee: CYBERSWARM, INC., San Mateo, CA (US)

( * ) Notice: Subject to any disclaimer, the term of this patent is extended or adjusted under 35 U.S.C. 154(b) by 0 days.

(21) Appl. No.: 16/431,885

(22) Filed: Jun. 5, 2019

(65) Prior Publication Data

US 2019/0378878 A1    Dec. 12, 2019

Related U.S. Application Data

(60) Provisional application No. 62/683,345, filed on Jun. 11, 2018.

(51) Int. Cl.
*H10B 63/00*    (2023.01)
*G06N 3/063*    (2023.01)
(Continued)

(52) U.S. Cl.
CPC ............ *H10B 63/82* (2023.02); *G06N 3/063* (2013.01); *H10B 63/30* (2023.02);
(Continued)

(58) Field of Classification Search
CPC ............ H01L 27/2472; H01L 27/2436; H01L 45/1206; H01L 45/122; H01L 45/1286;
(Continued)

(56) References Cited

U.S. PATENT DOCUMENTS 4,931,763 A   6/1990 Ramesham et al.
6,501,191 B2 * 12/2002 Tanaka .............. H01L 21/67253
                                                    118/724
(Continued)

FOREIGN PATENT DOCUMENTS

DE     112010004470 B4 * 12/2013 ............. G06N 3/063
KR        102009569 B1 *  8/2019

OTHER PUBLICATIONS

European Search Report in EP Application No. 19 17 9180 dated Nov. 25, 2019.
(Continued)

*Primary Examiner* — Edward Chin
(74) *Attorney, Agent, or Firm* — DLA Piper LLP (US)

(57) ABSTRACT

A synapse crossbar array device is provided. The synapse crossbar array device includes a plurality of Indium-Gallium-Zinc-Oxide (IGZO) thin film transistors (TFTs) and a plurality of IGZO resistive synapses. Each IGZO resistive synapse includes a IGZO resistive layer, a first electrical contact electrically coupled to one of the plurality of IGZO TFTs and a second electrical contact electrically connected to one of a plurality of column connection lines. The first electrical contact and the second electrical contact of each IGZO resistive synapse are disposed on the IGZO resistive layer of the resistive synapse. The synapse crossbar array device includes IGZO resistive synapses that have, each of them, an established resistance value. The synapse crossbar array may be fully transparent and may be integrated into the displays with which portable devices are provided.

15 Claims, 4 Drawing Sheets

(51) Int. Cl.
    *H10N 70/00*    (2023.01)
    *H10N 70/20*    (2023.01)
(52) U.S. Cl.
    CPC ......... *H10N 70/253* (2023.02); *H10N 70/821* (2023.02); *H10N 70/8613* (2023.02)
(58) Field of Classification Search
    CPC ...... G06N 3/063; G06N 3/0635; G06N 3/002; G06N 3/065; H10B 63/30; H10N 70/245; H10N 70/826
    See application file for complete search history.

(56) References Cited

U.S. PATENT DOCUMENTS

| | | | | |
|---|---|---|---|---|
| 10,418,417 | B1* | 9/2019 | Oh | .................. G11C 13/003 |
| 10,867,237 | B2* | 12/2020 | Cario | .................. G06N 3/063 |
| 2005/0275038 | A1 | 12/2005 | Shih et al. | |
| 2011/0119214 | A1* | 5/2011 | Breitwisch | .......... G11C 13/0002 |
| | | | | 706/33 |
| 2012/0284217 | A1 | 11/2012 | Breitwisch et al. | |
| 2017/0193356 | A1* | 7/2017 | Park | ..................... G06N 3/065 |
| 2018/0039881 | A1 | 2/2018 | Ikeda et al. | |
| 2018/0039882 | A1 | 2/2018 | Ikeda et al. | |
| 2018/0293205 | A1* | 10/2018 | Koker | .............. G06F 13/4027 |
| 2018/0349761 | A1* | 12/2018 | Lee | ..................... G06N 3/063 |
| 2018/0349762 | A1* | 12/2018 | Lee | ..................... H01L 27/1159 |
| 2019/0324309 | A1* | 10/2019 | Tominaga | ................ G09F 9/30 |

OTHER PUBLICATIONS

Hu, et al., "Highly Uniform Resistive Switching Properties of Amorphous InGaZnO Thin Films Prepared by a Low Temperature Photochemical Solution Deposition Method", ACS, pp. 6, (Apr. 9, 2014).

Examination Report issued in EP 19 179 180.5 dated Nov. 4, 2021.

* cited by examiner

SYNAPSE ARRAY

This application claims the benefit of U.S. Provisional Patent Application No. 62/683,345, filed Jun. 11, 2018, which is incorporated by reference in its entirety.

BACKGROUND

Artificial intelligence (AI) gets more and more embedded in various devices, especially portable ones like smartphones, smartglasses, smartwatches, etc. However, nowadays most portable devices that use AI depend on servers in the cloud and associated online connectivity. While dedicated chips and neural processing units embedded in the portable devices that allow running AI algorithms offline start to appear, they are power-consuming and expensive.

Typically, AI systems are based on training artificial neural networks formed by neurons and synapses to recognize images, voices, patterns, etc. During the training, the weights of the synapses get adjusted until the neural network is able to recognize the desired patterns. This process requires much computing power and is also power-consuming.

However, for mass product portable devices in many applications, it may be more advantageous to use totally or at least partially hardware implemented neural networks that are already ex-situ trained in labs using sophisticated algorithms and powerful computers. In many situations, in order to recognize patterns, a device does not need to be able to learn by itself. It may be enough to have an ex-situ trained neural network implemented in hardware. For this, it may be necessary to implement synapses having established weight values according to the desired patterns to be recognized. There are some attractive possibilities to use as synapses resistive memories with multiple states or resistors with fixed resistance values where synapse weight values are given by the resistance values.

US 20170300806A1 describes a neuromorphic device having synapses with fixed resistance values built in silicon. However, the silicon based synapses require a lot of memory and storage space that is difficult to be provided in portable devices.

For portable devices, it will be highly advantageous to have synapses having established weight values possible to be integrated in the large area displays with which they are already provided.

SUMMARY

The present disclosure is directed to an Indium-Gallium-Zinc-Oxide (IGZO) resistive synapse crossbar array where each synapse has an established resistance value. The IGZO resistive synapse crossbar array may be fully transparent and may be integrated into the displays with which portable devices are provided. The resistive synapse crossbar array may be built employing IGZO thin film transistor (TFT) technology.

DETAILED DESCRIPTION OF THE DRAWINGS

DETAILED DESCRIPTION

As discussed herein, the present disclosure is directed to an IGZO resistive synapse crossbar array where each synapse has an established resistance value. The resistive synapse crossbar array may be fully transparent and may be integrated into the displays with which portable devices are provided. IGZO is a transparent semiconductor widely used for realization of transparent thin films transistors (TFTs) employed in display realization. The resistive synapse crossbar array may be built to employ IGZO TFT technology.

In one embodiment, the IGZO based resistive synapse crossbar array is transparent to visible light.

In one embodiment, the IGZO based resistive synapse crossbar array further includes IGZO TFTs.

In one embodiment, the IGZO based synapses are built to have the same resistivity but different dimensions and thus different resistance values.

In one embodiment, the IGZO synapses are built to have the same dimensions but different resistivities and thus different resistance values. The different resistivities can be obtained by on-chip, local, thermal treatment of each individual synapse as described, for instance in U.S. Patent Application Ser. No. 62/683,341 and U.S. Patent Application No. 62/784,082. The local thermal treatment of each individual synapse may be performed by applying one or more voltage sweeps or voltage pulses. During the voltage sweeps or pulses, the IGZO synapse gets heated and increases its resistivity by a certain amount.

In one embodiment, the IGZO based synapses are built to have different dimensions and different resistivities. The different resistivities can be obtained by on-chip, local, thermal treatment of the individual synapse that may heat the synapse and modify its resistivity. The on-chip, local, thermal treatment of the individual synapse can be used for fine tuning of the individual synapse resistance values. An "on-chip" treatment may represent a treatment applied on an individual synapse by comparison with some treatments that can be performed at the same time on all synapses.

Figure 1:
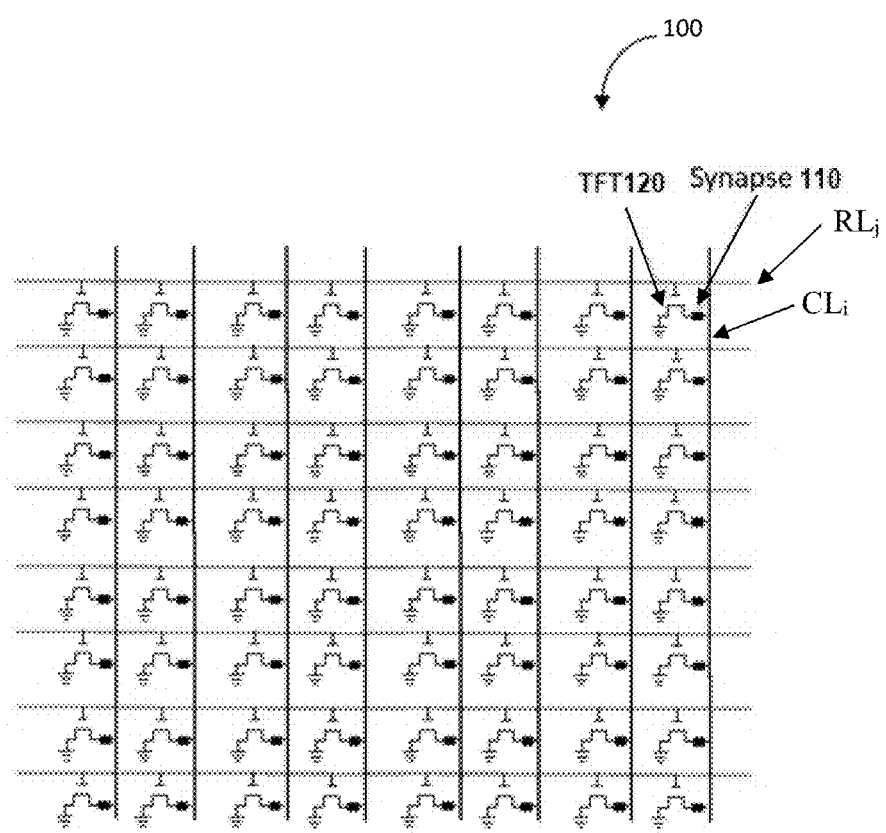
FIG. 1 illustrates an IGZO resistive synapses crossbar array in accordance with at least one example embodiment of the present disclosure.

FIG. 1 shows an IGZO resistive synapse crossbar array 100 which includes a plurality of array elements. Each array element includes an Indium-Gallium-Zinc-Oxide (IGZO) resistive synapse 110 and an IGZO thin film transistor (TFT) 120 coupled with each other through a substrate and a dielectric layer. The resistive synapse crossbar array 100 includes a plurality of column connection lines $CL_1$~$CL_i$ arranged in parallel to each other and extended in a first direction. The resistive synapse crossbar array 100 further includes a plurality of row connection lines $RL_1$~$RL_j$ arranged in parallel to each other and extended in a second direction. Each IGZO TFT 120 includes source, drain, and gate contacts. The gate contact of each IGZO TFT 120 is connected to an adjacent row connection line $RL_j$. Each synapse 110 includes a first electrical contact connected to a source/drain contact of an IGZO TFT 120 and a second electrical contact connected to an adjacent column connection line $CL_i$. A selective signal may be applied to a gate contract of an IGZO TFT 120 through respective row connection line RL$_j$ such that respective IGZO synapse 110 connected to the IGZO TFT 120 can be applied with one or more voltage sweeps or voltage pulses via the adjacent column connection line CL$_i$. A power input or voltage generator may be used to apply one or more voltage sweeps or voltage pulses to a second electrical contact of the IGZO resistive synapse via the adjacent column connection line CL$_i$. Different resistivities of the IGZO resistive synapses may be obtained by applying on-chip local specific heating employing one or more voltage sweeps or voltage pulses. A specific voltage sweeps or voltage pulses sequence may be applied to each IGZO resistive synapse to modify the resistivity of each synapse individually. Thus, each synapse 110 has an established resistance value that gives the synapse weight. The resistance values of the resistive synapses are established according to the desired patterns to be recognized by the device that incorporates the IGZO resistive synapse crossbar array. For the fabrication of the IGZO resistive synapse crossbar array, standard procedures may be employed for IGZO TFTs fabrication. A glass substrate or any other substrate usually used for IGZO TFTs fabrication may be employed. The IGZO layer may be deposited by sputtering. The electrical contacts made from Ti/Au, Al, Mo, indium tin oxide (ITO), aluminum zinc oxide (AZO), or any other metallization schema which is usually employed for the realization of electrical contacts of IGZO thin film transistors, can be realized by sputtering, electron-gun evaporation, thermal evaporation or any other deposition method usually used in the field. The synapse electrical contacts may be done in the same way as source and drain contacts for IGZO TFTs. The dielectric layer can be made of a dielectric material such as SiO2, Al2O3, AlN, etc. The crossbar connection lines can be made of the same materials as electrical contacts. By employing ITO or AZO transparent contacts, IGZO based resistive synapse crossbar array fully transparent to visible light can be obtained.

Figure 2:
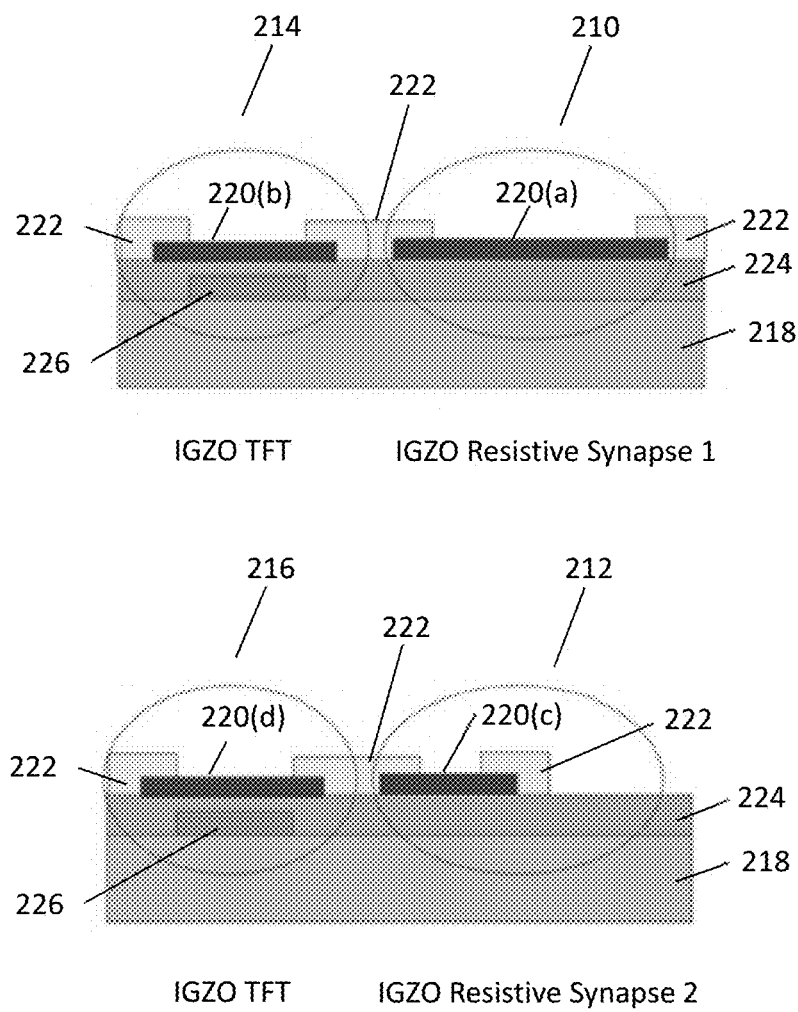
FIG. 2 illustrates two IGZO resistive synapses having different dimensions and being each connected with an IGZO TFT in accordance with at least one example embodiment of the present disclosure.

FIG. 2 shows a cross-sectional view of two IGZO resistive synapses 210 and 212 from the IGZO resistive synapse crossbar array, each synapse having different dimensions and thus different resistance values, and being each connected with a corresponding IGZO TFT 214 and 216 through a glass substrate 218 and a dielectric layer 224. For the fabrication of the IGZO resistive synapse crossbar array having synapses with different dimensions with different resistance value, standard procedures may be employed for IGZO TFTs fabrication. For instance, the glass substrate 218 or any other substrate usually used for IGZO TFTs fabrication may be employed. A gate contact 226 of a corresponding IGZO TFT 214 and 216 may be disposed on the glass substrate 218 and embedded in the dielectric layer 224. The IGZO layer 220(a)-220(d) may be deposited by sputtering. An electrical contact 222 of each IGZO TFT is coupled with an electrical contact 222 of each IGZO resistive synapse. The electrical contacts 222 made from Ti/Au, Al, Mo, indium tin oxide (ITO), aluminum zinc oxide (AZO), or any other metallization schema which is usually employed for the realization of electrical contacts of IGZO thin film transistors, can be realized by sputtering, electron-gun evaporation, thermal evaporation or any other deposition method usually used in the field. The synapse contacts may be formed in the same way as source and drain contacts for TFTs. The dielectric layer 224 can be formed from a dielectric material such as SiO$_2$, Al$_2$O$_3$, AlN, etc. The crossbar connection lines can be made of the same materials as electrical contacts. By employing ITO or AZO transparent contacts, IGZO based resistive synapse crossbar array fully transparent to visible light can be obtained.

The synapses with different dimensions may be patterned by applying standard photolithographic technique. The IGZO layer 220(b) and 220(d) for TFTs and the IGZO layers 220(a) and 220(c) for synapses may be realized in the same deposition run. First, the IGZO layer may be deposited for TFTs, followed by the standard high temperature annealing step usually done in the IGZO TFT fabrication process in order to increase the resistivity of the IGZO layer. After that, the IGZO layer for synapses may be deposited, followed by an on-chip, local, thermal treatment of each individual synapse that will modify its resistivity. The local thermal treatment of the each individual synapse may be performed by applying one or more voltage sweeps or voltage pulses that will heat the synapse and modify its resistivity. For example, a selective signal may be applied to a gate contract 222 of an IGZO TFT 214 through respective row connection line RL$_j$ such that respective IGZO synapse 210 connected to the IGZO TFT 214 can be applied with one or more voltage sweeps or voltage pulses via the adjacent column connection line CL$_i$. A power input or voltage generator may be used to apply one or more voltage sweeps or voltage pulses to a second electrical contact of the IGZO resistive synapse 210 via the adjacent column connection line CL$_i$. Different resistivities of the IGZO resistive synapses 210 and 212 may be obtained by selecting a corresponding IGZO TFT 214 or 216 and applying on-chip local specific heating employing one or more voltage sweeps or voltage pulses. A specific voltage sweeps or voltage pulses sequence may be applied to each IGZO resistive synapse to modify the resistivity of each synapse individually. In this way, the synapse is built as a programmable resistive memory.

Figure 3:
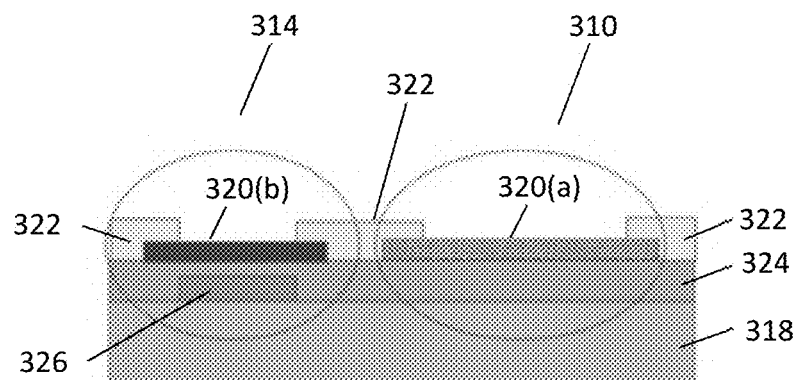
FIG. 3 illustrates two IGZO resistive synapses having different resistivities and being each connected with an IGZO TFT in accordance with at least one example embodiment of the present disclosure.
Figure 3:
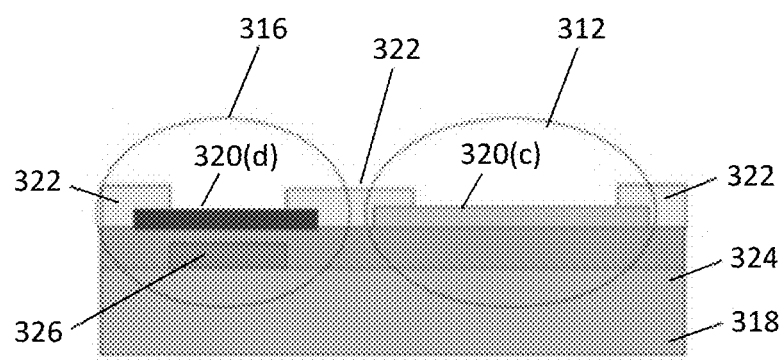

FIG. 3 shows a cross-sectional view of two IGZO resistive synapses 310 and 312 from the IGZO resistive synapse crossbar array, the synapses having the same dimensions but different resistivities and thus different resistance value, and being each connected with a corresponding IGZO TFT 314 and 316 through a glass substrate 318 and a dielectric layer 324. For the fabrication of the IGZO resistive synapse crossbar array having synapses with same dimensions but different resistivities and thus different resistance value, standard procedures may be employed for IGZO TFTs fabrication. The glass substrate 318 or any other substrate usually used for IGZO TFTs fabrication may be employed. A gate contact 326 of a corresponding IGZO TFT 314 and 316 may be disposed on the glass substrate 318 and embedded in the dielectric layer 324. The IGZO layer 320(a)-320(d) may be deposited by sputtering. The electrical contacts made from Ti/Au, Al, Mo, ITO, AZO, or any other metallization schema which is usually employed for the realization of electrical contacts of IGZO thin film transistors, can be realized by sputtering, electron-gun evaporation, thermal evaporation or any other deposition method usually used in the field. The synapse contacts may be formed in the same way as source and drain contacts for TFTs. The dielectric layer 324 can be formed from a dielectric material such as SiO$_2$, Al$_2$O$_3$, AlN, etc. The crossbar connection lines can be made of the same materials as electrical contacts. By employing ITO or AZO transparent contacts, IGZO based resistive synapse crossbar array fully transparent to visible light can be obtained. The IGZO layer 320(b) and 320(d) for TFTs and the IGZO layers 320(a) and 320(c) for synapses may be realized in different deposition runs. First, the IGZO layer may be deposited for TFTs, followed by the standard high temperature annealing step usually done in the IGZO TFT fabrication process in order to increase the resistivity of the IGZO layer. After that, the IGZO layer for synapses may be deposited, followed by an on-chip, local, thermal treatment of each individual synapse that will modify its resistivity. The local thermal treatment of the each individual synapse may be performed by applying one or more voltage sweeps or voltage pulses that will heat the synapse and modify its resistivity. For example, a selective signal may be applied to a gate contract 322 of an IGZO TFT 314 through respective row connection line $RL_j$ such that respective IGZO synapse 310 connected to the IGZO TFT 314 can be applied with one or more voltage sweeps or voltage pulses via the adjacent column connection line $CL_i$. A power input or voltage generator may be used to apply one or more voltage sweeps or voltage pulses to a second electrical contact of the IGZO resistive synapse 310 via the adjacent column connection line $CL_i$. Different resistivities of the IGZO resistive synapses 310 and 312 may be obtained by selecting a corresponding IGZO TFT 314 or 316 and applying on-chip local specific heating employing one or more voltage sweeps or voltage pulses. A specific voltage sweeps or voltage pulses sequence may be applied to each IGZO resistive synapse to modify the resistivity of each synapse individually. In this way, the synapse is built as a programmable resistive memory.

Figure 4:
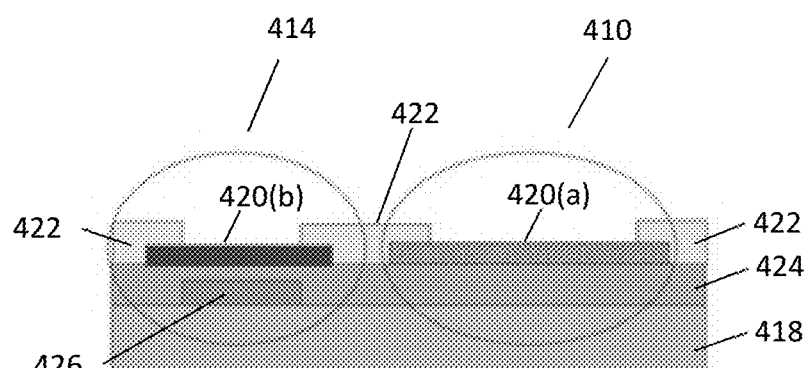
FIG. 4 illustrates two IGZO resistive synapses having different dimensions and different resistivities and being each connected with an IGZO TFT in accordance with at least one example embodiment of the present disclosure.
Figure 4:
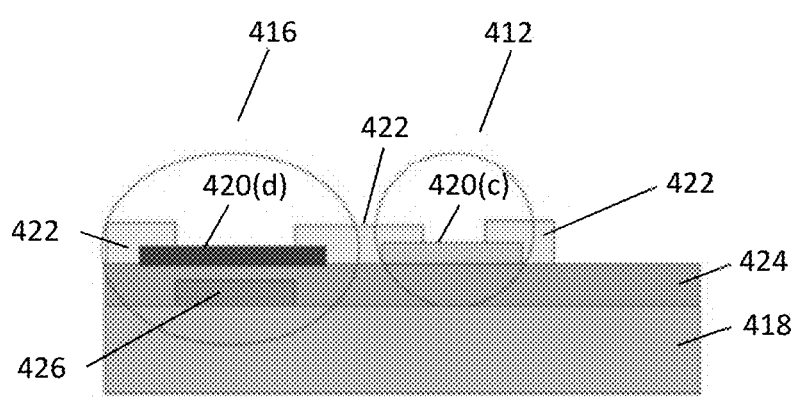

FIG. 4 shows a cross-sectional view of two IGZO resistive synapses 410 and 412 from the IGZO resistive synapse crossbar array, the synapses having the different dimensions and different resistivities and thus different resistance value, and being each connected with a corresponding IGZO TFT 414 or 416 through a glass substrate 418 and a dielectric layer 424. For the fabrication of the IGZO resistive synapse crossbar array having synapses with different dimensions and different resistivities and thus different resistance value, standard procedures employed for IGZO TFTs fabrication may be employed. A gate contact 426 of a corresponding IGZO TFT 414 and 416 may be disposed on the glass substrate 418 and embedded in the dielectric layer 424. The glass substrate 418 or any other substrate usually used for IGZO TFTs fabrication may be employed. The IGZO layer 420(a)-420(d) may be deposited by sputtering. The electrical contacts 422 made from Ti/Au, Al, Mo, ITO, AZO, or any other metallization schema which is usually employed for the realization of electrical contacts of IGZO thin film transistors, can be realized by sputtering, electron-gun evaporation, thermal evaporation or any other deposition method usually used in the field. The synapse contacts may be formed in the same way as source and drain contacts for TFTs. The dielectric layer 424 can be made of a dielectric material such as $SiO_2$, $Al_2O_3$, AlN, etc. The crossbar connection lines can be done from the same materials as electrical contacts. By employing ITO or AZO transparent contacts, IGZO based resistive synapse crossbar array fully transparent to visible light can be obtained. The synapses with different dimensions may be patterned by standard photolithographic technique. The IGZO layers 420(b) and 420(d) for TFTs and the IGZO layers 420(a) and 420(c) for synapses may be realized in different deposition runs. First, it may be deposited the IGZO layer for TFTs, followed by the standard high temperature annealing step usually done in the IGZO TFT fabrication process in order to increase the resistivity of the IGZO layer. After that, the IGZO layer for synapses may be deposited, followed by an on-chip, locally thermal treatment of the each individual synapse that will modify its resistivity. The locally thermal treatment of the each individual synapse may be done by applying one or more voltage sweeps or voltage pulses that will heat the synapse and modify its resistivity. For example, a selective signal may be applied to a gate contract 422 of an IGZO TFT 414 through respective row connection line $RL_j$ such that respective IGZO synapse 410 connected to the IGZO TFT 414 can be applied with one or more voltage sweeps or voltage pulses via the adjacent column connection line $CL_i$. A power input or voltage generator may be used to apply one or more voltage sweeps or voltage pulses to a second electrical contact of the IGZO resistive synapse 410 via the adjacent column connection line $CL_i$. Different resistivities of the IGZO resistive synapses 410 and 412 may be obtained by selecting a corresponding IGZO TFT 414 or 416 and applying on-chip local specific heating employing one or more voltage sweeps or voltage pulses. A specific voltage sweeps or voltage pulses sequence may be applied to each IGZO resistive synapse to modify the resistivity of each synapse individually. In this way, the synapse is built as a partially programmable resistive memory.

The various embodiments described above are provided by way of illustration only and should not be construed to limit the scope of the disclosure. Various modifications and changes may be made to the principles described herein without following the example embodiments and applications illustrated and described herein, and without departing from the spirit and scope of the disclosure.

What is claimed is:

1. A synapse crossbar array device pre-configured to recognize a pattern, the synapse crossbar array device comprising:
   a plurality of Indium-Gallium-Zinc-Oxide (IGZO) thin film transistors (TFTs); and
   a plurality of IGZO resistive synapses, each IGZO resistive synapse comprising an IGZO resistive layer, a first electrical contact electrically coupled to one of the plurality of IGZO TFTs and a second electrical contact electrically connected to one of a plurality of column connection lines;
   wherein the first electrical contact and the second electrical contact are disposed on the IGZO resistive layer of a corresponding IGZO resistive synapse, and each IGZO resistive synapse having pre-established, factory fabricated dimension and resistivity corresponding to a synapse weight value specific to the pattern such that the synapse crossbar array device is pre-configured to recognize the pattern using the plurality of IGZO resistive synapses,
   wherein the synapse weight value is configured to be non-adjustable during a use of the synapse crossbar array device,
   wherein the synapse crossbar array device is fully transparent to visible light and is integrated in a display.

2. The synapse crossbar array device of claim 1, wherein different IGZO resistive synapses have same resistivities with different dimensions.

3. The synapse crossbar array device of claim 1, wherein different IGZO resistive synapses have same dimensions with different resistivities and are built as programmable resistive memories.

4. The synapse crossbar array device of claim 3, wherein the different resistivities of the different IGZO resistive synapses are obtained by applying on-chip local specific heating employing one or more voltage sweeps or voltage pulses.

5. The synapse crossbar array device of claim 1, wherein the IGZO resistive synapses have different dimensions and different resistivities, and are built as partially programmable resistive memories.

6. The synapse crossbar array device of claim 5, wherein the different resistivities of the different IGZO synapses are obtained by applying on-chip local specific heating employing one or more voltage sweeps or voltage pulses.

7. The synapse crossbar array device of claim 1, wherein the plurality of column connection lines are arranged in parallel to each other and extended in a first direction.

8. The synapse crossbar array device of claim 1, wherein each of the plurality of TFTs comprises a gate contact connected to one of a plurality of row connection lines.

9. The synapse crossbar array device of claim 8, wherein the plurality of the row connection lines are arranged in parallel to each other and extended in a second direction.

10. The synapse crossbar array device of claim 1, wherein the first and second electrical contacts of each IGZO resistive synapse are made of at least one of Ti/Au, Al, Mo, indium tin oxide (ITO), aluminum zinc oxide (AZO), or any combination thereof.

11. The synapse crossbar array device of claim 1, wherein each IGZO resistive synapse comprises a dielectric layer disposed between the IGZO layer and a substrate.

12. The synapse crossbar array device of claim 11, wherein the dielectric layer is made of at least one of $SiO_2$, $Al_2O_3$, AlN, or any combination thereof.

13. The synapse crossbar array device of claim 11, wherein each IGZO resistive synapse is coupled to an adjacent TFT through a substrate and a dielectric layer.

14. The synapse crossbar array device of claim 1, wherein each IGZO resistive synapse is built as a programmable resistive memory.

15. The synapse crossbar array device of claim 1, wherein each IGZO resistive synapse is built as a partially programmable resistive memory.

* * * * *